United States Patent
Fedeli

[11] Patent Number: 6,103,545
[45] Date of Patent: Aug. 15, 2000

[54] PROCESS FOR MAKING A MAGNETORESISTIVE MAGNETIC SENSOR AND SENSOR OBTAINED USING THIS PROCESS

[75] Inventor: Jean-Marc Fedeli, Saint Martin d'Heres, France

[73] Assignee: Commissariat a l'Energie Atomique, Paris, France

[21] Appl. No.: 08/948,091

[22] Filed: Oct. 9, 1997

[30] Foreign Application Priority Data

Oct. 22, 1996 [FR] France .................................. 96 12812

[51] Int. Cl.[7] .................................................. H01L 21/00
[52] U.S. Cl. ............................................. 438/53; 438/702
[58] Field of Search ........................... 73/777, 779, 715, 73/727, 728, 754; 216/2; 257/419; 438/48, 53, 701, 702, 703, 705, 719

[56] References Cited

U.S. PATENT DOCUMENTS 5,260,653  11/1993  Smith et al. .
5,483,735  1/1996   Postma et al. .

FOREIGN PATENT DOCUMENTS 0 600 549  6/1994  European Pat. Off. .

Primary Examiner—Savitri Mulpuri
Attorney, Agent, or Firm—Oblon, Spivak, McClelland, Maier & Neustadt, P.C.

[57] ABSTRACT

Process for manufacturing a magnetoresistive magnetic sensor using in magnetometry and a sensor obtained using this process. According to the invention, the sensor comprises two concentrator guides (32, 34) embedded in a substrate (20). The inclined flanks of these guides correspond to the crystallographic planes of the substrate (20). The magnetoresistance (40) is placed on the substrate (20) between guides (32, 34).

6 Claims, 5 Drawing Sheets

PROCESS FOR MAKING A MAGNETORESISTIVE MAGNETIC SENSOR AND SENSOR OBTAINED USING THIS PROCESS

TECHNICAL FIELD

The purpose of this invention is a process for making a magnetoresistive sensor and a sensor obtained using this process. It has applications particularly in magnetometry.

STATE OF THE PRIOR ART

Magnetic sensors composed of a magnetoresistive element placed between two magnetic flux guides designed to concentrate the field to be measured, are known. In a variant of these sensors, the flux guides are in the form of a stack of layers, this stack being etched to present an inclined flank. Document U.S. Pat. No. 5,260,653 describes this type of sensor. The essential steps in its manufacturing process are illustrated on FIGS. 1A and 1B in the appendix.

Firstly, FIG. 1A shows a magnetoresistive strip 10 and two flux guides 12 and 14 composed of a stack of magnetic layers. This figure corresponds to a first manufacturing step in which guides 12 and 14 have been etched obliquely.

FIG. 1B shows a second step in which a magnetic layer has been deposited on the assembly and then etched so that all that remains are parts 16 and 18 above stacks 12 and 14. Layers 16 and 18 provide intimate coupling with the thick parts of the guides, and with the magnetoresistance that they cover.

This manufacturing process has a disadvantage, in that it is difficult to make this type of inclined flank by etching. In any case, this etching is not very reproducible. Furthermore, this technique requires an additional magnetic layer to form the coupling (layers 16, 18) and this layer must be etched above the magnetoresistance, which is not very easy.

The purpose of this invention is to overcome these disadvantages.

DESCRIPTION OF THE INVENTION

Consequently, the invention recommends that a crystalline substrate with crystallographic planes should be used, and that these planes should be used to make the oblique flanks necessary for flux concentration. These flanks may be obtained very simply by etching the crystalline substrate with excellent reproducibility. According to another characteristic of the invention, the flux guides are embedded in the compartments with inclined flanks formed in the substrate. The magnetoresistive layer is then formed on the assembly. There is no longer any need for an additional magnetic coupling layer.

Specifically, the purpose of this invention is a manufacturing process for a magnetoresistive magnetic sensor, characterized in that it includes the following operations:

start from a crystalline substrate with crystallographic planes, etch this substrate on each side on a central area to obtain two compartments with inclined flanks, along a crystallographic plane of the substrate, fill these two compartments with at least one magnetic material, to form two magnetic flux guides, a magnetoresistance is formed on the substrate and within the central area.

Preferably, a magnetoresistance is formed that overlaps the flux guides.

According to another variant, a magnetic layer is formed on the two magnetic flux guides that is etched in two parts before the magnetoresistance is formed, and the magnetoresistance which overlaps these two magnetic parts is formed afterwards.

Preferably, a magnetic layer which overlaps the magnetoresistance is deposited after forming the magnetoresistance.

Preferably, the substrate is a semiconductor substrate, for example silicon.

Another purpose of the invention is a magnetoresistive magnetic sensor obtained by the process and comprising a magnetoresistance placed between two magnetic flux guides with inclined flanks, characterized in that these flux guides are embedded in a substrate with crystallographic planes, the flux guides fill two compartments formed in this substrate on each side of a central area, these compartments having inclined flanks corresponding to a crystallographic plane of the substrate, the magnetoresistance being placed on the substrate in the central area.

DETAILED DESCRIPTION OF EMBODIMENTS

FIGS. 2 to 8 illustrate some of the steps in a process for making a sensor in accordance with the invention.

Figure 1A:
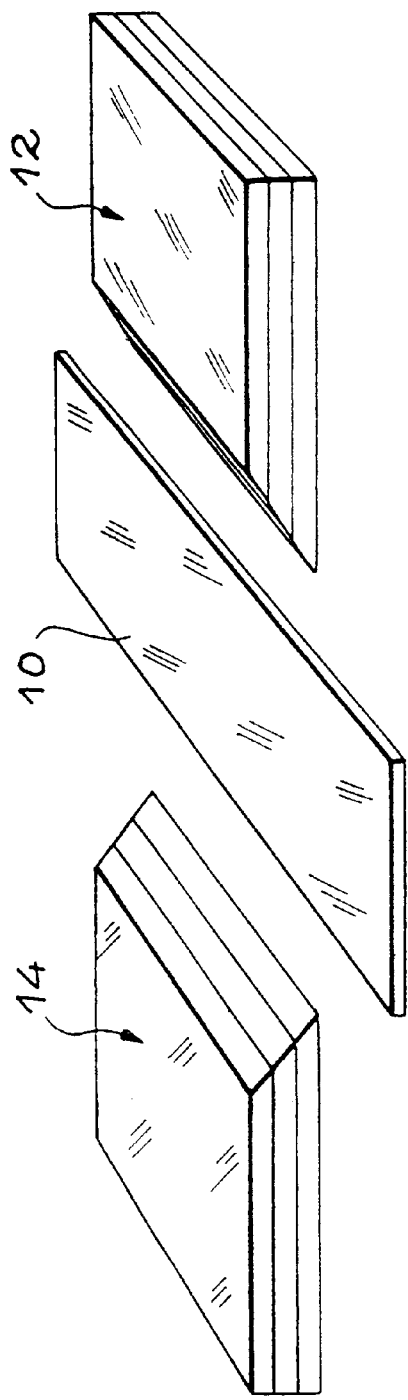
FIGS. 1A and 1B, described above, show two steps in a known process for making a sensor.
Figure 1B:
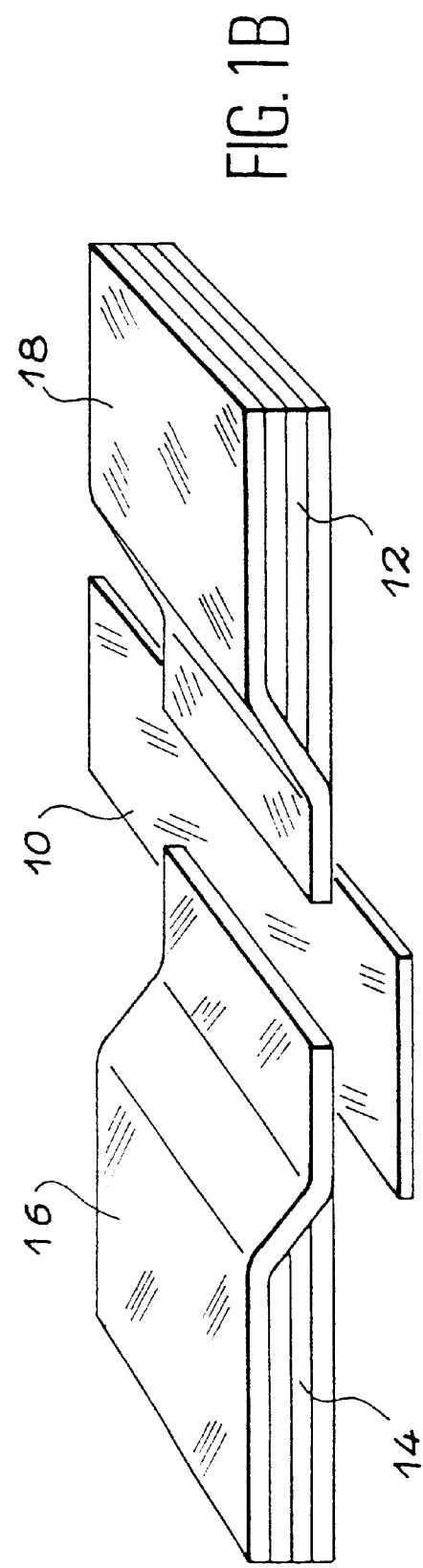
Figure 2:
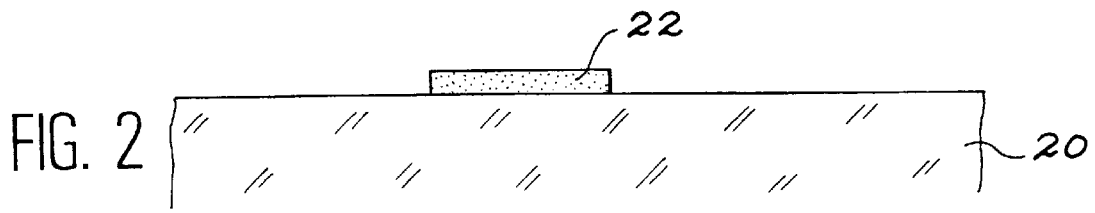
FIG. 2 shows a first step in the process according to the invention.
Figure 3:
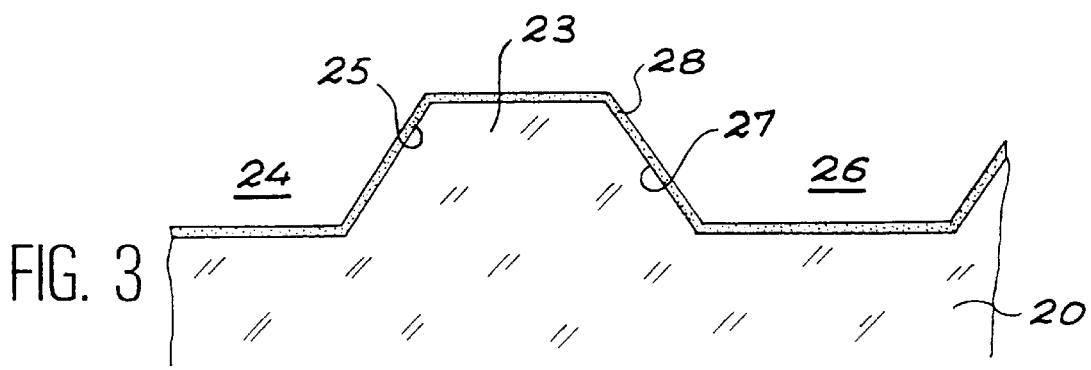
FIG. 3 shows another step in this process after formation of the compartments.

Starting from a substrate 20, for example oriented silicon <100>, on which a resin mask 22 (FIG. 2A) is deposited. The substrate is then chemically etched, for example using a solution of KOH, to obtain two compartments 24 and 26 with inclined flanks, denoted 25, 27 respectively (FIG. 3). The etching depth is between 1 $\mu$m and 100 $\mu$m; for example it may be about 10 $\mu$m. With oriented silicon <100>, the flanks obtained are inclined at 55° from the horizontal. The mask 22 is then eliminated to expose the central area 23 located between the two compartments.

A thermal oxidation is then done to obtain an insulating layer 28 covering the assembly. This layer is made of $SiO_2$, in the case of silicon. Its thickness may be 0.5 $\mu$m.

Figure 4:
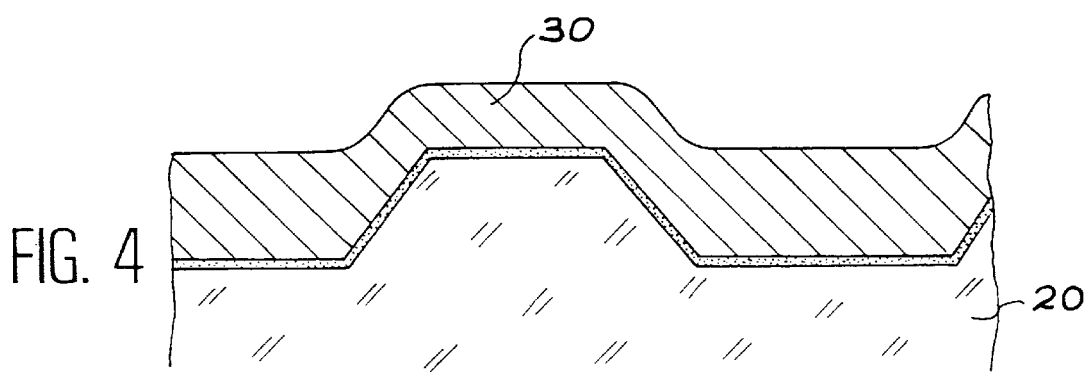
FIG. 4 shows another step in this process, with filling of the compartments.
Figure 5:
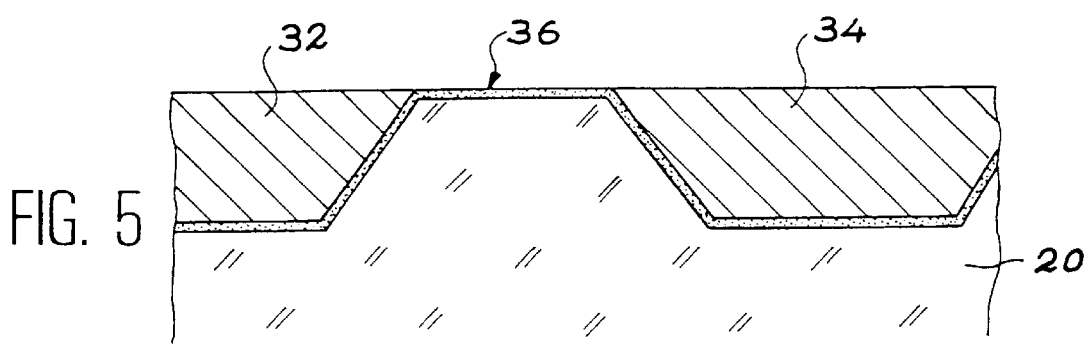
FIG. 5 shows another step in this process, in which two flux guides are obtained.

A magnetic layer 30 is then deposited in the compartments and on the central area. This deposit may be done electrolytically. In this case, a conducting sub-layer is deposited firstly (for example made of Cr or Au), and a layer 30, for example of Ni or Fe—Ni, is grown on the assembly, with a thickness exceeding the depth of the compartments (FIG. 4). The excess magnetic material is removed by polishing the assembly to make the two magnetic parts 32, 34 forming the flux guides flush with each other, and to show the oxidized surface of the substrate in the central area 36 (FIG. 5).

Figure 6:
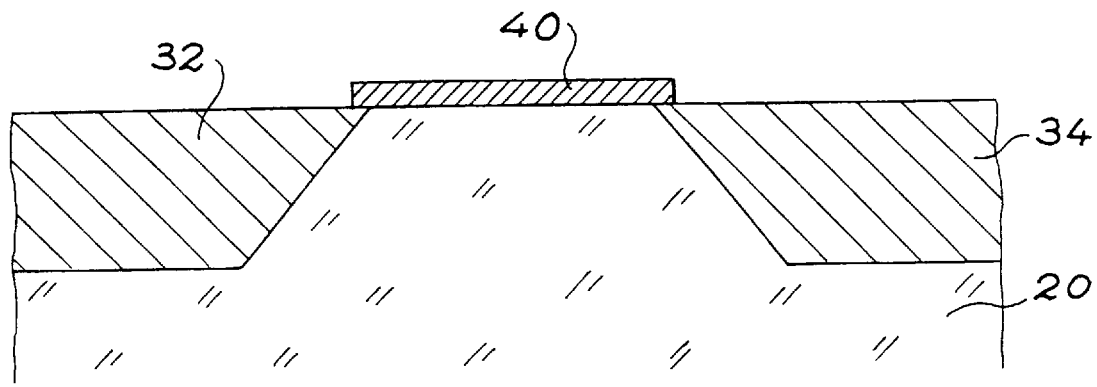
FIG. 6 shows the magnetoresistance formation step.

One or several layers of a magnetoresistive material with a total thickness of less than 100 nm are then deposited, for example by cathodic spraying, and this layer is etched (for example by ionic machining) to leave only a strip 40 (FIG. 6). This strip slightly overlaps the threaded end of flux guides 32 and 34.

Figure 7:
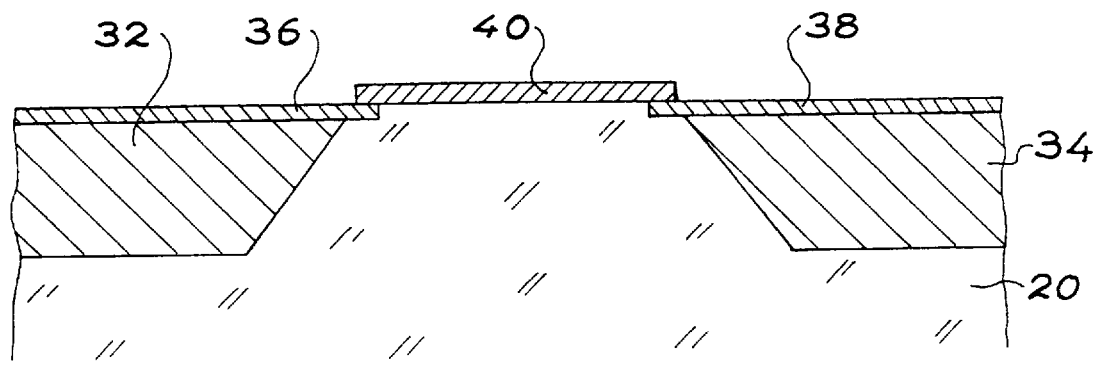
FIG. 7 illustrates a variant using an additional magnetic layer.

In a variant of the embodiment shown in FIG. 7, in which the flux guides 32 and 34 are further away from each other, an additional magnetic layer is deposited (for example 0.2 μm thick) that is etched to provide two layers 36, 38 covering guides 32, 34 and slightly overlapping them. The magnetoresistance 40 is not formed until afterwards, and overlaps layers 36, 38.

Figure 8:
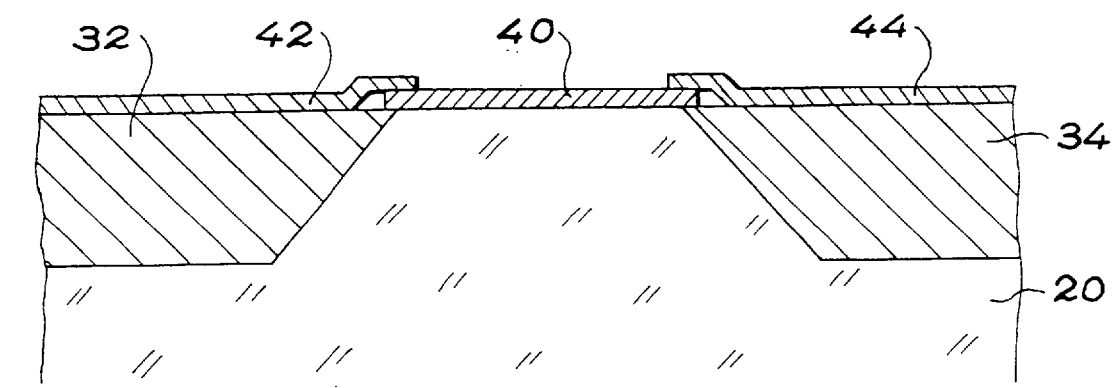
FIG. 8 illustrates another variant with double overlap.

According to another variant shown in FIG. 8, after the assembly complying with FIG. 6 is made, a magnetic layer 42, 44 is deposited which overlaps the magnetoresistance 40. Therefore it is doubly overlapped on its edges by layers 42, 44 and guides 32, 34.

In this latter variant, layers 42, 44 may or may not be in contact with guides 32, 34.

Figure 9:
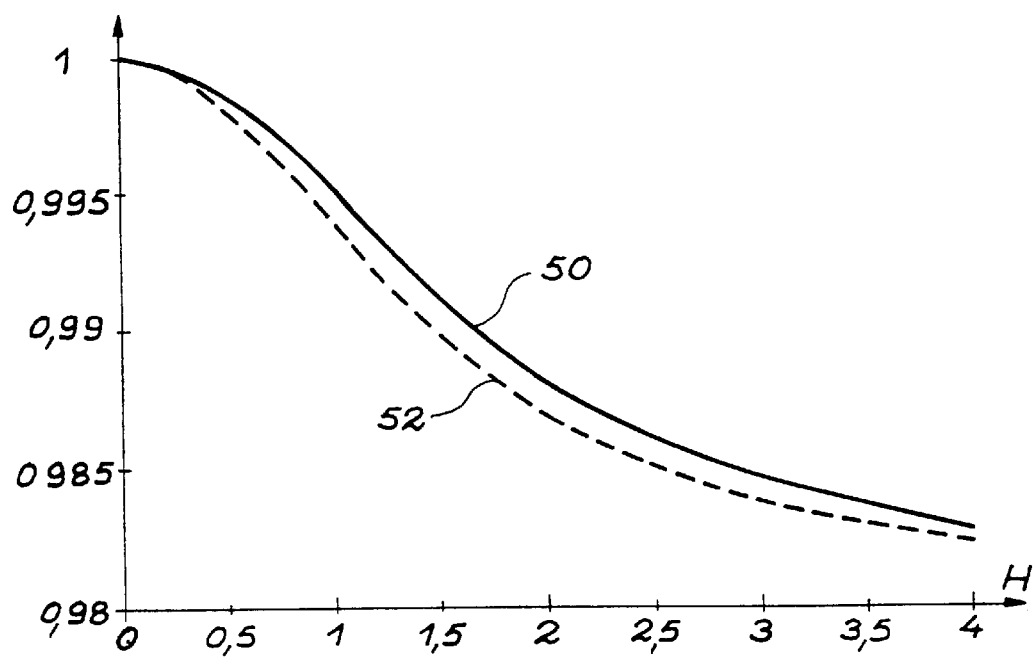
FIG. 9 shows the compared variations of the measurement signal for a sensor using prior art and for a sensor according to the invention.
Figure 10:
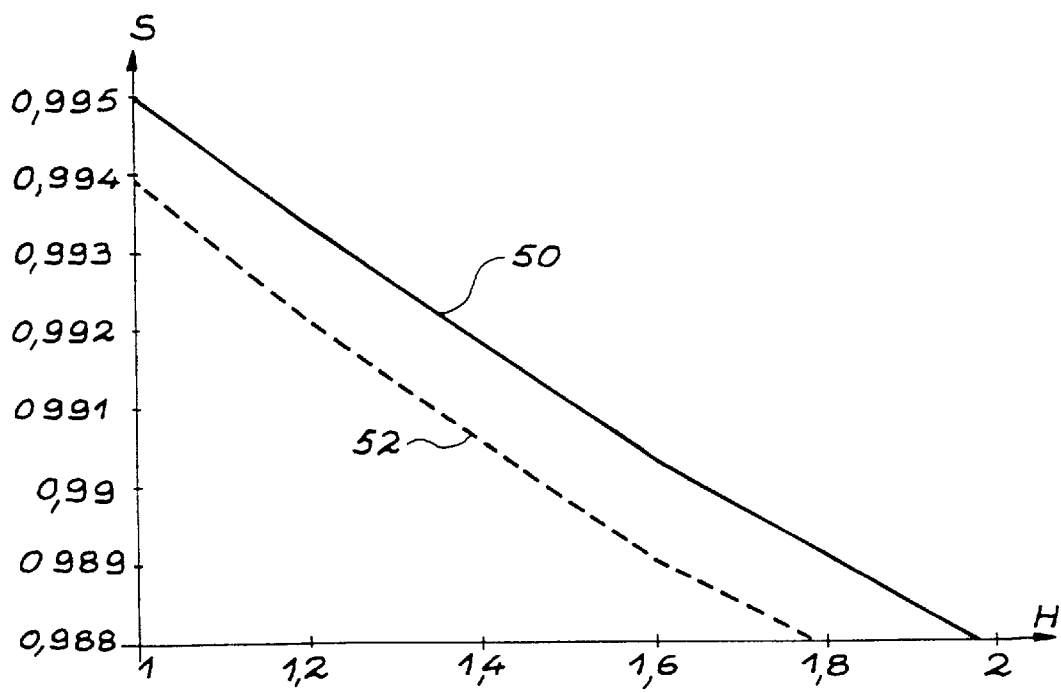
FIG. 10 is an enlargement of FIG. 9.

FIGS. 9 and 10 compare the sensitivity of a sensor conform with the invention, and the sensitivity of a sensor using prior art. The curves show the variations in the measurement signal S applicable to a same unit, as a function of the applied magnetic field H. Curve 50 applies to prior art, and curve 52 to the invention in the case of the double overlapping variant (FIG. 8). These curves show that the sensors according to the invention are more sensitive than sensors using prior art.

Figure 11:
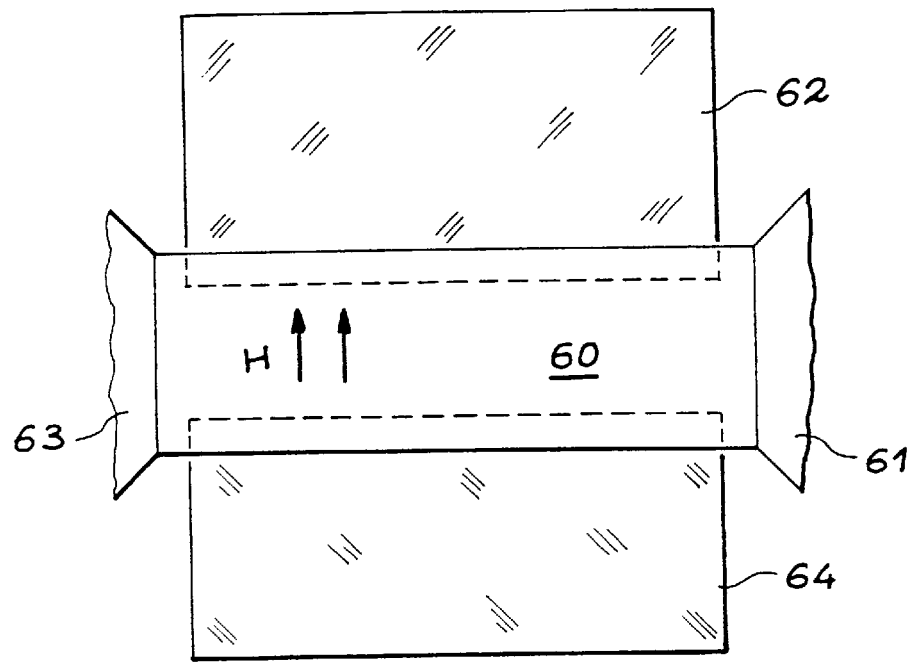
FIG. 11 shows a top view of a sensor according to the invention with a magnetoresistance working in transverse mode.
Figure 12:
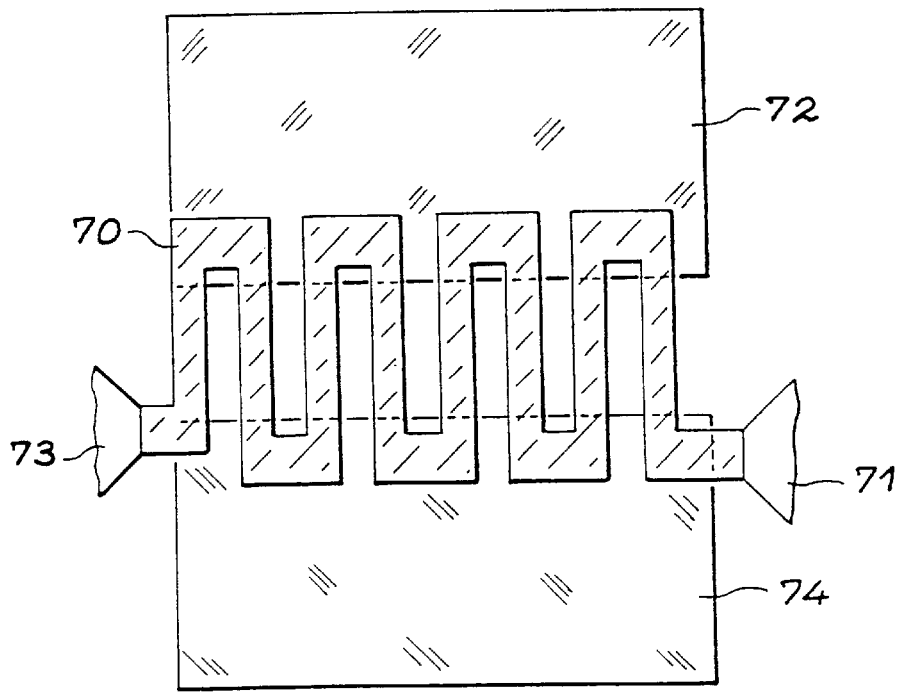
FIG. 12 is another top view showing another variant with a meandering magnetoresistance operating in longitudinal mode.

The magnetoresistance used in the invention may be of any known type: anisotropic or GMR (for example with spins valve, etc.). It may have any shape. In FIG. 11, it is a strip 60 connected to two electrical connections 61 and 63. This type of magnetoresistance operates in transverse mode. The magnetic field H is actually perpendicular to the large sides of the strip, these large sides partially covering the two flux guides 62 and 64. In the case shown in FIG. 12, the magnetoresistance 70 is a meandering pattern. Its ends are still connected to two electrical connections 71, 73 and flux guides 72, 74 are covered by horizontal branches of the magnetoresistance. Therefore this magnetoresistance works in longitudinal mode, in its branches going from one guide to the other.

What is claimed is:

1. A process for making a magnetoresistive magnetic sensor, comprising the steps of:

etching a crystalline substrate having crystallographic planes on each side of a central area to obtain two compartments with inclined flanks, along a crystallographic plane of the crystalline substrate;

filling said two compartments with at least one magnetic material, to form two magnetic flux guides;

forming a magnetoresistance on the substrate and within the central area.

2. The process according to claim 1, wherein forming said magnetoresistance is performed so that said magnetoresistance overlaps the flux guides.

3. The process according to claim 1, wherein forming said magnetoresistance comprises:

forming a magnetic layer on the two magnetic flux guides; and etching said magnetic layer in two magnetic parts so as to form a magnetoresistance that overlaps said two magnetic parts.

4. The process according to claim 1, further comprising depositing a magnetic layer overlapping the magnetoresistance after forming the magnetoresistance.

5. The process according to any one of claims 1 to 4, wherein the crystalline substrate comprises a semiconducting substrate.

6. The process according to claim 5, wherein the crystalline substrate comprises a silicon substrate.

* * * * *